United States Patent [19]

Nakagawa et al.

[11] Patent Number: 5,055,568

[45] Date of Patent: Oct. 8, 1991

[54] PROCESS FOR PREPARATION OF CELLULOSE NITRATE FILMS

[75] Inventors: Hiroaki Nakagawa; Masahiro Kondo; Noriake Ohishi, all of Iwakuni, Japan

[73] Assignee: Mitsui Petrochemical Industries, Ltd., Tokyo, Japan

[21] Appl. No.: 247,013

[22] Filed: Sep. 21, 1988

Related U.S. Application Data

[63] Continuation of Ser. No. 60,799, Jun. 12, 1987, Pat. No. 4,812,279.

[30] Foreign Application Priority Data

Jun. 12, 1986 [JP] Japan .................. 61-137212

[51] Int. Cl.$^5$ .................. C08B 5/02; C08L 1/18; C09J 4/00; B32B 7/02
[52] U.S. Cl. .................. 536/35; 106/195; 428/213; 428/215
[58] Field of Search .................. 536/35; 106/195; 428/213, 215

[56] References Cited

U.S. PATENT DOCUMENTS 4,536,240 8/1985 Winn .................. 156/246

FOREIGN PATENT DOCUMENTS 58-219023 12/1983 Japan .

Primary Examiner—Nathan M. Nutter
Attorney, Agent, or Firm—Sughrue, Mion, Zinn, Macpeak & Seas

[57] ABSTRACT

Disclosed is a process for the preparation of cellulose ester films, which comprises dissolving a cellulose ester in an organic solvent, coating the solution on a substrate under rotation and peeling the film formed on the substrate from the substrate, wherein a second organic solvent having a compatibility with the organic solvent and being a poor solvent to the cellulose ester is added to the organic solvent solution of the cellulose ester to precipitate a cellulose ester having a high molecular weight in the cellulose ester, the cellulose ester having a high molecular weight is separated from the solution, and the remaining cellulose ester solution is formed into a cellulose ester film by the rotational film-forming menthod.

The cellulose ester film prepared according to this process is excellent in the thickness uniformity and free of color nonuniformity or streaks and has good optical properties.

13 Claims, 1 Drawing Sheet 5,055,568

PROCESS FOR PREPARATION OF CELLULOSE NITRATE FILMS

This is a continuation of application Ser. No. 071060,799 filed June 12, 1987 and now U.S. Pat. No. 4,812,279.

BACKGROUND OF THE INVENTION (1) Field of the Invention

The present invention relates to a process for the preparation of cellulose ester films excellent in optical characteristics and thickness uniformity. More particularly, the present invention relates to a process for preparing a film from a solution of a cellulose ester such as nitrocellulose by the rotational film-forming method. Moreover, the present invention relates to a photomask-protecting optical film obtained according to this process.

(2) Description of the Prior Art

Since a film of a cellulose ester such as nitrocellulose is used as an optical film for protecting a photomask such as LSI or a reticule from dusts, development of a process capable of forming a cellulose ester film free of color nonuniformity or streaks and having good optical characteristics is desired.

As means for preparing such a cellulose ester film, there has been adopted the so-called rotational film-forming method in which a cellulose ester is dissolved in an organic solvent, the solution is supplied to the horizontal surface of a rotary member and the solution is expanded and formed into a film by a centrifugal force generated by rotation of the rotary member. As typical known instances of this method, there can be mentioned (1) a process in which nitrocellulose is dissolved in an alcohol, a ketone or a polyglycol such as 1,2-dimethoxyethane and a film is prepared from the solution by the rotational film-forming method (see Japanese Patent Application Laid-Open Specification No. 196501/83), (2) a process in which a cellulose ester, specifically nitrocellulose (Nitrocellulose RS-7 supplied by Daicel Kagaku Kogyo), in a lower fatty acid ester or ketone such as butyl acetate, isobutyl acetate or cyclohexanone and a film is prepared from the solution by the rotational film-forming method (see Japanese Patent Laid-Open No. 219023/83), and (3) a process in which a mixture of nitrocellulose with a plasticizer such as diethyl phthalate, dibutyl phthalate or dioctyl phthalate is dissolved in a mixed solvent comprising a dissolving agent, for example, a ketone such as acetone or methylethyl ketone or an ester such as ethyl acetate or butyl acetate, and a diluent such as xylene or toluene and the solution is formed into a film by the rotational film-forming method (see Japanese Patent Laid-Open No. 182730/84).

It was found that when a cellulose ester film is prepared from the above-mentioned starting material by the rotational film-forming method, a film having good optical properties is not always obtained.

In the rotational film-forming method, in order to prevent degradation of the thickness uniformity or reduction of the light transmission by incorporation of a foreign substance into the film and resulting flowing movement of the foreign substance, the cellulose ester solution should be filtered before the film-forming operation. However, the above-mentioned starting material is defective in that the filtering property is insufficient.

SUMMARY OF THE INVENTION

We found that in preparing a film from an organic solvent solution of a cellulose ester by the rotational film-forming method, if a fraction having a high molecular weight, preferably together with a gelatinous substance or an impurity having a low solubility, is removed from the cellulose solution by the fractional precipitation before the rotational film-forming operation, the filtration can be easily performed, and the thickness of the obtained film is uniform and the optical characteristics are prominently improved.

It also was found that when nitrocellulose is used as the cellulose ester and methylisobutyl ketone is used as the organic solvent, a solution improved in the filtering property and film-forming property over other combinations is obtained and an excellent photomask-protecting film, that is, an excellent pellicle, can be obtained.

More specifically, in accordance with the present invention, there is provided a process for the preparation of cellulose ester films, which comprises dissolving a cellulose ester in an organic solvent, coating the solution on a substrate under rotation and peeling the film formed on the substrate from the substrate, wherein a second organic solvent having a compatibility with the organic solvent and being a poor solvent to the cellulose ester is added to the organic solvent solution of the cellulose ester to precipitate a cellulose ester having a high molecular weight in the cellulose ester, preferably together with a gelatinous substance or an impurity having a low solubility, the cellulose ester having a high molecular weight is separated from the solution, and the remaining cellulose ester solution is formed into a cellulose ester film by the rotational film-forming method.

In accordance with another aspect of the present invention, there is provided a process for the preparation of nitrocellulose films, which comprises forming a solution of nitrocellulose in methylisobutyl ketone or a mixture of methylisobutyl ketone and methyl alcohol as the solvent which contains nitrocellulose and methylisobutyl ketone at a weight ratio of from 30/1 to 10/1, adding hexane as the poor solvent to the solution so that the hexane/solvent volume ratio is from 0.8 to 1.5, to thereby precipitate nitrocellulose having a high molecular weight, preferably together with a gelatinous substance or an impurity having a low solubility, separating the precipitated nitrocellulose having a high molecular weight from the solution, heating the remaining solution at a temperature higher than the boiling point of the poor solvent to separate the poor solvent, filtering the remaining solution, coating the filtered solution on a substrate under rotation to form a film of nitrocellulose on the substrate, and peeling the formed nitrocellulose film from the substrate.

In accordance with still another aspect of the present invention, there is provided a photomask-protecting optical film formed from a nitrocellulose solution by the rotational film-forming method, wherein the nitrocellulose has a nitration degree of 11 to 12.5% and a weight average molecular weight ($\overline{M}w$) of 150,000 to 350,000, the film thickness unevenness ratio, defined by the following formula, of the film is less than 1%:

$$\frac{\text{maximum thickness} - \text{minimum thickness}}{\text{average thickness}} \times 100 \quad (1)$$

and the film is transparent and free of color non uniformity over the entire surface.

DETAILED DESCRIPTION OF THE PREFERRED EMBODIMENTS

Figure 1:
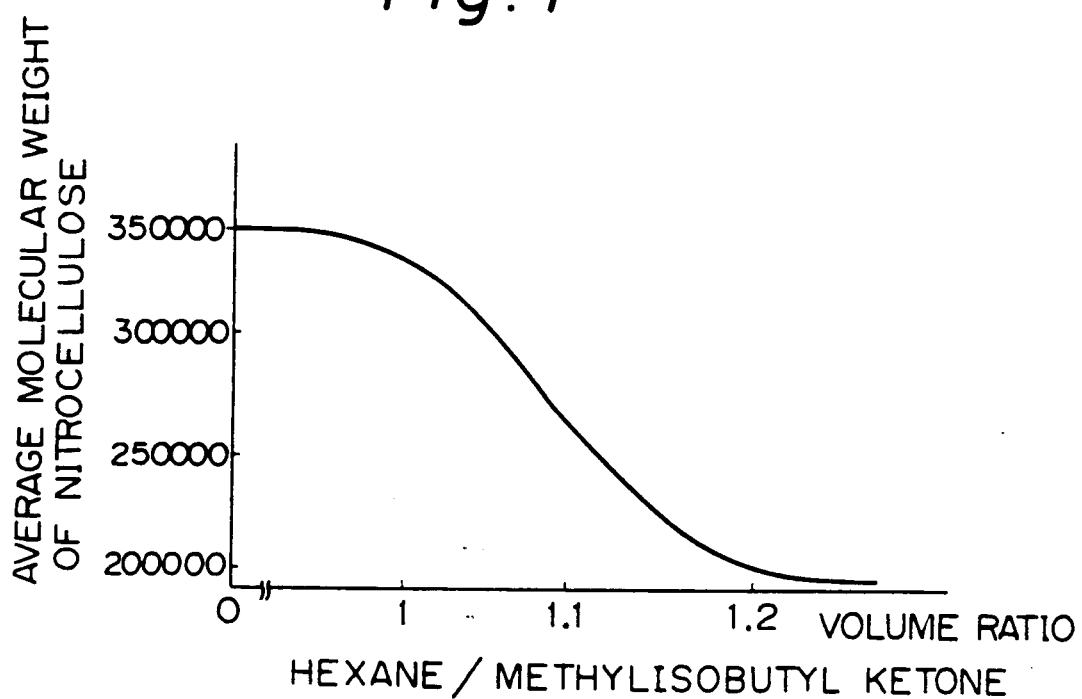
FIG. 1 is a graph illustrating the relation of the average molecular weight of nitrocellulose to the poor solvent/methylisobutyl ketone volume ratio.

The process of the present invention can be applied to a cellulose ester. As the cellulose ester, there can be mentioned nitrocellulose, acetylcellulose, cellulose sulfate, cellulose phosphate, cellulose propionate and other fatty acid cellulose esters. Nitrocellulose and cellulose propionate are preferably used and nitrocellulose is especially preferred. The following description will be made mainly with reference to embodiments where nitrocellulose is used, but it must be noted that the present invention is not limited to these embodiments.

Nitrocellulose having a nitration degree (N %) of 11 to 12.5%, especially 11.5 to 12.2%, and a weight average molecular weight ($\overline{M}w$) of 150,000 to 350,000, especially 170,000 to 320,000, is used. Nitrocellulose is obtained by nitrating a starting cellulose with a mixed acid comprising nitric acid, sulfuric acid and water. If impurities such as hemicelluloses and resins are contained in the starting cellulose, the resulting nitrocellulose is yellowed and the optical characteristics are degraded, and the stability of the film is poor. Accordingly, high-purity celluloses having an α-cellulose content of at least 98%, especially cotton, cotton linter, waste cotton and cotton tissue paper, are used as the starting cellulose. These starting celluloses have a considerably high molecular weight, and therefore, nitrocellulose obtained from these starting celluloses have a high molecular weight.

According to the present invention, in preparing a film from an organic solvent solution of nitrocellulose by the rotational film-forming method, nitrocellulose having a high molecular weight, preferably together with a gelatinous substance or an impurity having a low solubility, is fractionally precipitated and the precipitate is removed from the cellulose solution, whereby the stability, filtering property and film-forming property of the film-forming nitrocellulose solution are improved, and the thickness distribution in the obtained nitrocellulose film is uniformalized and the optical characteristics are prominently improved.

Ketone type solvents such as methylisobutyl ketone (MIBK), acetone, methylethyl ketone, diethyl ketone, diisobutyl ketone, cyclohexanone and diacetone alcohol are preferred as the organic solvent for nitrocellulose, and methylethyl ketone is especially suitable for attaining the objects of the present invention because methylisobutyl ketone provides a film having a uniform thickness and being free of color nonuniformity or streaks. Of course, organic solvents that can be used in the present invention are not limited to those mentioned above. For example, there can be used alcohols such as methanol and ethanol, ethers such as tetrahydrofuran, 1,2-dimethoxyethane and 1,2-diethoxyethane, and esters such as ethyl acetate, ethyl lactate, n-butyl formate and butyl acetate. These solvents may be used singly or in the form of mixtures of two or more of them.

It is preferred that in the cellulose ester solution used in the present invention, the weight ratio of the cellulose ester to the solvent such as methylisobutyl ketone be from 30/1 to 10/1, especially from 20/1 to 10/1.

If methyl alcohol is added to the cellulose ester solution before the addition of the poor solvent according to a preferred embodiment of the present invention, the speed of precipitation of the cellulose ester having a high molecular weight, caused when the poor solvent is added, is increased. It is preferred that the amount added of methyl alcohol be smaller than the volume of methylisobutyl ketone. In this embodiment, it is preferred that the amount added of the poor solvent be smaller than the total volume of methylisobutyl ketone and methyl alcohol.

As the poor solvent for the cellulose ester, there can be mentioned hexane, heptane, methylcyclohexane, cyclohexane, toluene, octane, naphthas such as solvent naphtha and cyclonaphtha, and xylene. However, since it is necessary to remove this poor solvent afterwards by heating, poor solvents having a boiling point lower than the boiling point of the solvent such as methylisobutyl ketone, especially aliphatic hydrocarbons and alicyclic hydrocarbons having 5 to 10 carbon atoms, such as hexane, heptane, methylcyclohexane and cyclohexane, are advantageously used. In view of the easy availability and cost, hexane is esepcially preferred.

It is preferred that the amount added of the poor solvent be such that the poor solvent/solvent volume ratio is from 0.8 to 1.5, and from the practical view point, it is especially preferred that this volume ratio be from 1.0 to 1.20. If the amount of the poor solvent is smaller than the amount of the solvent such as methylisobutyl keton, precipitation of the cellulose ester having a high molecular weight is not advantageously advanced. The change of the average molecular weight of the cellulose ester (nitrocellulose), caused when the volume ratio of the poor solvent (hexane) to the solvent (methylisobutyl ketone), is illustrated in the graph of FIG. 1. It is understood that as the amount added of the poor solvent is increased, the average molecular weight of nitrocellulose is decreased, that is, the high-molecular-weight fraction is precipitated. However, if the amount added of the poor solvent is too large, the amount of the solution of refined nitrocellulose is reduced, and the productivity is degraded.

After the addition of the poor solvent, the cellulose ester having a high molecular weight, preferably, together with a gelatinous substance or an impurity having a low solubility, is removed by such means as decantation or centrifugal separation, and the remaining poor solvent is then removed from the solution to obtain a refined cellulose ester solution. Removal of the poor solvent is accomplished by heating the solution at a temperature lower than the boiling point of the solvent such as methylisobutyl ketone but higher than the boiling point of the poor solvent to evaporate the poor solvent. At this step, the cellulose ester solution may be placed under a reduced pressure.

The refined cellulose ester solution may be directly formed into a film by the rotation film-forming method. However, it is preferred that the solution be filtered to remove a foreign substance and the solution be then formed into a film. Filtration is accomplished according to the compression filtration method using a filter having a mesh size of, for example, 0.2 μm.

Figure 2:
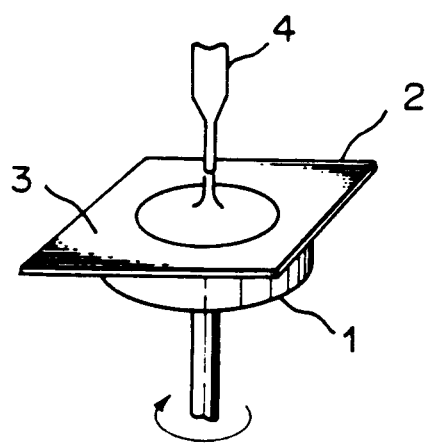
FIG. 2 is a perspective view illustrating an apparatus for use in carrying out the process for the preparation of nitrocellulose films according to the present invention, in which reference numerals, 1, 2 and 3 represent a turn table, a substrate and a horizontal surface, respectively.

An example of the apparatus for sue in carrying out the rotational film-forming method will now be described. In this apparatus, as shown in FIG. 2, a substrate 2 is placed on a turn table 1 rotated and driven, and the substrate 2 is used as a rotary member and the top surface of the substrate 2 is kept horizontal to form a horizontal surface 3. The cellulose ester solution is supplied to this horizontal surface 3 from a nozzle 4 and the turn table 1 is turned, whereby also the substrate 2 is rotated and by the centrifugal force, the cellulose ester solution is thinly spread along the horizontal surface 3 to form a cellulose ester film.

The rotation speed of the substrate 2 is ordinarily 400 to 4,000 rpm and preferably 500 to 3,000 ppm. The substrate 2 may be rotated at a constant speed, or there may be adopted a method in which the substrate 2 is rotated at a low speed (200 to 1,000 rpm) at the time of rising and the speed is increased (400 to 4,000 rpm) in the midway.

If a parting agent is coated on the horizontal surface 3 of the substrate 2 in advance, the cellulose ester film can be easily peeled from the horizontal surface 3.

The nitrocellulose film formed according to the present invention has a nitration degree corresponding to that of starting nitrocellulose, but this nitrocellulose film is characterized in that the weight average molecular weight ($\overline{M}w$) of the film is lower than that of starting nitrocellulose and is generally 150,000 to 350,000 and preferably 170,000 to 320,000. Moreover, this nitrocellulose is substantially free of impurities such as hemicelluloses, resins and lignin and is homogeneous in the composition. The thickness unevenness ratio, defined by the above-mentioned formula (1), of the film is less than 1%. especially less than 0.7%. The film is transparent and free of color nonuniformity over the entire surface. The thickness of the film can be widely changed. However, it is preferred that the thickness of the film be 0.5 to 6 μm, especially 0.8 to 3 μm.

The present invention will now be described in detail with reference to the following examples that by no means limit the scope of the invention.

EXAMPLE 1

A nitrocellulose solution was prepared by using 142 g of nitrocellulose (alcohol-swollen nitrocellulose containing 30% of isopropyl alcohol which was HIG-20 supplied by Asahi Kasei Kogyo; average molecular weight=370,000; nitration degree=11.5 to 12.2%), 12 g of methylisobutyl ketone and 1240 g of methyl alcohol, and 2320 g of hexane was dropped and added to the nitrocellulose solution (the total volume of methylisobutyl ketone and methyl alcohol was 3130 ml, the volume of hexane was 3520 ml and the latter former volume ratio was 1.12). The mixture was allowed to stand still overnight and was then subjected to decantation. Only the supernatant was recovered while the precipitated high-molecular-weight nitrocellulose was removed. The supernatant was placed under a reduced pressure of 15 to 20 mmHg at 40° C. to remove hexane and methyl alcohol and obtain a refined nitrocellulose solution. The average molecular weight of nitrocellulose in the obtained refined nitrocellulose solution was 186,600.

The refined nitrocellulose solution was filtered under a pressure of 0.5 kg/cm$^2$. G by using a filter having a mesh size of 0.1 μm and a diameter of 142 mm and a nitrocellulose film was prepared by the rotational film-forming method. The filtration could be performed smoothly, and a nitrocellulose film being free of color nonuniformity or streaks and having good optical characteristics could be obtained. The rotational film formation was carried out by using a glass sheet having a diameter of 200 mm and adjusting its rotation speed to 2,000 to 2,500 rpm. The obtained results are shown in Table 1.

EXAMPLE 2

A nitrocellulose solution was prepared by dissolving 142 g of the same nitrocellulose as used in Example 1 in 1240 g of methylisobutyl ketone, and 1200 g of hexane was dropped and added to the nitrocellulose solution (the volume of methylisobutyl ketone was 1560 ml, the volume of hexane was 1820 ml and the latter/former volume ratio was 1.17). High-molecular-weight nitrocellulose was separated and removed by centrifugal separation (conducted at a rotation speed of 500 rpm for 2 minutes), and 2087 g of the remaining solution was placed under a reduced pressure of 12 to 20 mmHg at 45° C. to remove hexane and obtain a refined nitrocellulose solution. The average molecular weight of nitrocellulose in the obtained refined nitrocellulose solution was 226,100.

In the same manner as described in Example 1, the obtained refined nitrocellulose solution was filtered and a nitrocellulose film was prepared by the rotational film-forming method. The filtration could be performed smoothly and a nitrocellulose film being free of color nonuniformity or streaks and having good optical properties could be obtained. The rotational film formation conditions were the same as described in Example 1. The obtained results are shown in Table 1.

EXAMPLE 3

A nitrocellulose solution was prepared by dissolving 100 g of the same nitrocellulose as used in Example 1 in 640 g of methylisobutyl ketone, and 577 g of hexane was dropped and added to the nitrocellulose solution (the volume of methylisobutyl ketone was 800 ml, the volume of hexane was 880 ml and the latter/former volume ratio was 1.1). The mixture was allowed to stand still overnight, and decantation was carried out. Only the supernatant was recovered while the precipitated high-molecular-weight nitrocellulose was removed. The supernatant was placed under a reduced pressure of 15 to 20 mmHg at 45° C. to remove hexane and obtain a refined nitrocellulose solution. The average molecular weight of nitrocellulose in the obtained refined nitrocellulose solution was 280,000.

This refined nitrocellulose solution was filtered under the same conditions as described in Example 1 and a nitrocellulose film was prepared by the rotational film-forming method. The filtration could be performed smoothly and a nitrocellulose film being free of color nonuniformity or streaks and having good optical characteristics could be obtained. The rotational film formation conditions were the same as described in Example 1. The obtained results are shown in Table 1.

COMPARATIVE EXAMPLE 1

A nitrocellulose solution was prepared by dissolving 100 g of the same nitrocellulose as used in Example 1 in 1540 ml of methylisobutyl ketone and was then filtered, and a nitrocellulose film was prepared from the solution by the rotational film-forming method.

The filtration was carried out under a pressure of 1.5 to 2.5 kg/cm$^2$ G by using the same filter as used in Example 1, but with the lapse of time, the amount of the effluent was decreased and clogging was caused after filtration of 500 to 1000 ml. The obtained nitrocellulose film was free of color nonuniformity or streaks, but as shown in Table 2, the deviation of the thickness was larger than in the nitrocellulose films obtained in Examples 1 through 3.

ume of hexane was 920 ml and the latter/former volume ratio was 1.27). The mixture was allowed to stand still for 5 hours and decantation was carried out. Only the supernatant was recovered while the precipitated high-molecular-weight cellulose propionate was removed.

TABLE 1

| | Nitrocellulose Solution | | | | Volume Ratio of Hexane to Methylisobutyl Ketone (+ Methanol) | Separation Speed of High-Molecular-Weight Nitrocellulose (in case of decantation) |
|---|---|---|---|---|---|---|
| | Nitrocellulose HIG-20 (average molecular weight = 370,000) (g) | methylisobutyl ketone (g) | methanol (g) | Hexane (g) | | |
| Example 1 | 142 | 1240 (3130 ml) | 1240 | 2320, 3520 ml | 1.12 | complete separation after 2 minutes' standing |
| Example 2 | 142 | 1240, 1560 ml | 0 | 1200, 1820 ml | 1.17 | — |
| Example 3 | 100 | 640, 800 ml | 0 | 577, 880 ml | 1.1 | complete separation after 30 minutes' standing |
| Comparative Example 1 | 100 | 1230, 1540 ml | 0 | 0 | — | — |

| | Refined Nitrocellulos Solution | | | | Nitrocellulose Film | | | |
|---|---|---|---|---|---|---|---|---|
| | yield (g) | viscosity (CP/°C.) | average molecular weight (× 10⁴) of nitro-cellulose | filtering property | Rotation Speed (rpm) | average thickness (Å) | thickness range (maximum thickness- minimum thickness) | thickness unevenness ratio (thickness range/ average thickness) (× 100) | state of film |
| Example 1 | 472.1 | 203/25 | 18.86 | good | 2000–2500 | 8650 | 0–60 | 0.7 | free of color nonuniformity or streaks |
| Example 2 | 568 | 103/25 | 22.61 | good | 2000–2500 | 8650 | 0–60 | 0.7 | free of color nonuniformity or streaks |
| Example 3 | 380 | 89/25 | 28.00 | good | 2000–2500 | 8650 | 0–60 | 0.7 | free of color nonuniformity or streaks |
| Comparative Example 1 | | 158/25 | 37.00 | fair | 2000–2500 | 8650 | 80–150 | 0.92–1.7 | free of color nonuniformity or streaks |

From the results shown in Table 1, it is seen that if methylisobutyl ketone is used as the solvent for dissolving nitrocellulose and a fraction having a high molecular weight is removed from nitrocellulose, a refined nitrocellulose solution having a good filtering property is obtained, and that if methyl alcohol is added, the separation speed of high-molecular-weight nitrocellulose is increased.

It also is seen that when a film is prepared from this refined nitrocellulose solution by the rotational film-forming method, a nitrocellulose film excellent in the thickness uniformity over a comparative film prepared from a nitrocellulose solution containing high-molecular-weight nitrocellulose.

EXAMPLE 4

A cellulose propionate solution was prepared by dissolving 70 g of cellulose propionate (high molecular weight grade supplied by Aldrich) in 930 g of methylisobutyl ketone, and 605 g of hexane was dropped and added to the cellulose propionate solution (the volume of methylisobutyl ketone was 1170 ml, the vol- The supernatant was placed under a reduced pressure of 15 to 20 mmHg at 40° C. to remove hexane and obtain a refined cellulose propionate solution.

When circulation filtration of the refined cellulose propionate solution was carried out under a pressure of 0.5 kg/cm²·G by using a filter having a mesh size of 0.2 μm and a diameter of 142 mm, the filtration could be conducted without clogging of the filter even after 40 hours. When a film was prepared from the filtered refined cellulose propionate solution, a cellulose propionate film being free of color nonuniformity or streaks and having good optical characteristics could be obtained.

COMPARATIVE EXAMPLE 2

A cellulose propionate solution was prepared by dissolving 70 g of the same cellulose propionate as used in Example 4 in 1400 g of methylisobutyl ketone and was subjected to circulation filtration. The filtration became impossible after 4 hours. The thickness deviation of the cellulose propionate film prepared by the rotational film-forming method was larger than that of the film obtained in Example 4.

COMPARATIVE EXAMPLE 3

A cellulose propionate solution was prepared by dissolving 70 g of the same cellulose propionate as used in Example 4 in 1400 g of cyclohexanone and was subjected to circulation filtration. The filtration became impossible after 4 hours. The thickness deviation of the cellulose propionate film prepared by the rotational film-forming method was larger than that of the film obtained in Example 4.

We claim:

1. A photomask-protecting optical film formed from a nitrocellulose solution by the rotational film-forming method, wherein the nitrocellulose has a nitration degree of 11 to 12.5% and a weight average molecular weight ($\overline{MW}$) of 170,000 to 320,000, the film thickness unevenness ratio, defined by the following formula, of the film is less than 0.7%:

$$\frac{\text{maximum thickness} - \text{minimum thickness}}{\text{average thickness}} \times 100$$

and the film is transparent and free of color nonuniformity over the entire surface.

2. The photomask-protecting optical film of claim 1, wherein prior to the rotational film-forming method a high molecular weight nitrocellulose fraction is removed from starting nitrocellulose by fractional precipitation from an organic solvent.

3. The photomask-protecting optical film of claim 2, wherein the organic solvent is methylisobutyl ketone.

4. The photomask-protecting optical film of claim 3, wherein the organic solvent is a mixture of methylisobutyl ketone and methanol at a weight ratio of 30/1 to 10/1 and wherein hexane is further added as a poor solvent so that the hexane/organic solvent volume ratio is 0.8–1.5.

5. The photomask-protecting optical film of claim 4, wherein the weight ratio of the nitrocellulose to the organic solvent is from 30/1 to 10/1.

6. A photomask-protecting optical film, which consists essentially of a nitrocellulose film having a nitration degree of 11 to 12.5% and a weight average molecular weight ($\overline{MW}$) of 170,000 to 320,000, wherein said film has a film thickness unevenness ratio, defined by the following formula, of less than 0.7%:

$$\frac{\text{maximum thickness} - \text{minimum thickness}}{\text{average thickness}} \times 100$$

and the film is transparent and free of color nonuniformity over the entire surface, said film being obtained by removing a nitrocellulose having a higher molecular weight together with a gelatinous substance and an impurity having low solubility from a solution of a nitrocellulose raw material and forming the resultant nitrocellulose solution into the film by the rotational film-forming method.

7. The photomask-protecting optical film of claim 6, wherein the weight average molecular weight is 150,000 to 320,000 and the film thickness unevenness ratio is less than 0.7%.

8. The photomask-protecting optical film of claim 6, wherein the nitrocellulose having a higher molecular weight together with gelatinous substance and an impurity having low solubility are removed from a solution of a cellulose raw material by fractional precipitation from an organic solvent.

9. The photomask-protecting optical film of claim 8, wherein the organic solvent is methylisobutyl ketone.

10. The photomask-protecting optical film of claim 9, wherein the organic solvent is a mixture of methylisobutyl ketone and methanol at a weight ratio of 30/1 to 10/1 and wherein hexane is added as a poor solvent so that the hexane/organic solvent volume ratio is 0.8 to 1.5.

11. A photomask-protecting optical film as claimed in claim 10, wherein the weight ratio of the nitrocellulose to the organic solvent is from 30/1 to 10/1.

12. The photomask-protecting optical film of claim 1, wherein the nitration degree is 11.5 to 12.2%.

13. The photomask-protecting optical film of claim 6, wherein the nitration degree is 11.5 to 12.2%.

* * * * *